(12) United States Patent
Zhou

(10) Patent No.: US 12,022,625 B2
(45) Date of Patent: Jun. 25, 2024

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wenjun Zhou, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/614,365

(22) PCT Filed: Oct. 12, 2021

(86) PCT No.: PCT/CN2021/123170
§ 371 (c)(1),
(2) Date: Nov. 25, 2021

(87) PCT Pub. No.: WO2023/035352
PCT Pub. Date: Mar. 16, 2023

(65) Prior Publication Data
US 2024/0032211 A1 Jan. 25, 2024

(30) Foreign Application Priority Data
Sep. 10, 2021 (CN) .......................... 202111059234.X

(51) Int. Cl.
*H05K 5/00* (2006.01)
*H05K 5/02* (2006.01)

(52) U.S. Cl.
CPC ................................... *H05K 5/02* (2013.01)

(58) Field of Classification Search
CPC ........................ H05K 5/0017; H05K 5/0217
(Continued)

(56) References Cited

U.S. PATENT DOCUMENTS

2009/0066862 A1* 3/2009 Ishii .................. G02F 1/133308
349/12
2022/0310964 A1* 9/2022 Xia .................... H05K 7/20954
(Continued)

FOREIGN PATENT DOCUMENTS

| CN | 107004698 A | 8/2017 |
|---|---|---|
| CN | 110942720 A | 3/2020 |

(Continued)

OTHER PUBLICATIONS

Chinese Office Action issued in corresponding Chinese Patent Application No. 202111059234.X dated Mar. 25, 2022, pp. 1-9.
(Continued)

*Primary Examiner* — Hung S. Bui
(74) *Attorney, Agent, or Firm* — PV IP PC; Wei Te Chung; Zhigang Ma

(57) ABSTRACT

An embodiment of the present application discloses a display module and a display device. The display module includes a display panel, a backplate layer, a first support layer, a second support layer, and a reinforcing member; wherein an end of the first support layer toward a bending portion is shrunk internally relative to an end of the backplate layer and the second support layer toward the bending portion to form a notch, and the reinforcing member is disposed at least partially within the notch. The present application can solve a problem that a support force is insufficient due to the notch, a stress is relatively concentrated, and the display panel collapses.

20 Claims, 5 Drawing Sheets

(58) Field of Classification Search
USPC .......................................... 361/807, 809, 810
See application file for complete search history.

(56) References Cited

U.S. PATENT DOCUMENTS

| | | | |
|---|---|---|---|
| 2023/0104812 A1* | 4/2023 | Wang | G06F 3/04164 345/173 |
| 2023/0217603 A1* | 7/2023 | Zhu | B32B 7/02 361/807 |

FOREIGN PATENT DOCUMENTS

| | | | |
|---|---|---|---|
| CN | 111477670 A | 7/2020 | |
| CN | 111766729 A | 10/2020 | |
| CN | 112435590 A | 3/2021 | |
| CN | 213183388 U | 5/2021 | |
| CN | 113012579 A | 6/2021 | |
| CN | 113140158 A | 7/2021 | |
| CN | 113192420 A | 7/2021 | |
| JP | 2014232178 A | 12/2014 | |

OTHER PUBLICATIONS

International Search Report in International application No. PCT/CN2021/123170, mailed on Apr. 27, 2022.
Written Opinion of the International Searching Authority in International application No. PCT/CN2021/123170, mailed on Apr. 27, 2022.

\* cited by examiner

DISPLAY MODULE AND DISPLAY DEVICE

TECHNICAL FIELD

The present application relates to a display field, in particular to a display module and a display device.

BACKGROUND

Organic light-emitting display devices (OLED) have been widely used in life. As shown in FIG. 1, the organic light-emitting display devices include an organic light-emitting display panel 10. In order to achieve a narrow frame design of the organic light-emitting display devices, generally, the organic light-emitting display panel 10 is divided into a non-bending portion FF1 and a bending portion FF2. Generally, the bending portion FF2 is a part where a lower frame is bound or electrically connected to a driving chip and a circuit board. A backside of the non-bending portion FF1 of the organic light-emitting display panel 10 needs to be provided with a multi-layer support layer, for example, a backside of the organic light-emitting display panel 10 is sequentially provided with a BP1 layer (a backplate layer, usually made of polyimide or PET) 1011, a buffer layer (a first support layer, usually made of foam material, Foam) 1012, and an SUS layer (a second support layer, usually made of stainless-steel material) 1013. Since in a process of manufacturing the organic light-emitting display devices, the buffer layer 1012 and the SUS layer 1013 need to be bonded first, then the buffer layer 1012 and the SUS layer 1013 as a whole are bonded to the display panel 10, and a bonding process needs to use the SUS layer 1013 for grasping and positioning, the buffer layer 1012 needs to be set inwardly. This is, a length of the BP1 layer 1011 and the SUS layer 1013 close to an end of the bending portion FF2 is greater than a length of the buffer layer 1012 close to the end of the bending portion FF2, thereby forming a notch 133. A polarizer 21 is provided on a front side of the organic light-emitting display panel 10. A protective glue layer 24 is provided on a front side of the bending portion FF2. The protective glue layer 24 is usually disposed to contact an end of the polarizer 21 to prevent water vapor from entering through the end of the polarizer 21 and improve reliability. Because the buffer layer 1012 is set inwardly, a support of the BP1 layer 1011 is insufficient after the display panel 10 being bent, and the stress is relatively concentrated. The BP1 layer 1011 and the bending portion FF2 will collapse above the notch 133 (as shown in Figure, the dotted line frame is separated to form a collapse portion 52), resulting cracks in a film layer such as a trace of the collapse portion, thereby reducing the reliability of the display devices.

Technical Problems

An embodiment of the present application provides a display module and a display device. The display module and the display device can solve problems that a display panel collapses due to insufficient support force and relatively concentrated stress caused by a notch formed by inertial shrinkage of a support layer near a bending portion. The display module and the display device also solve technical problems that cracks in a film layer such as a trace of the display panel, thus, reducing reliability of the display device.

SUMMARY

An embodiment of the present application provides a display module, including:

a display panel including a bending portion and a non-bending portion;

a backplate layer disposed on a back side of the non-bending portion of the display panel;

a first support layer disposed on a side of the backplate layer away from the display panel;

a second support layer disposed on a side of the first support layer away from the display panel;

wherein an end of the first support layer toward the bending portion is shrunk internally relative to an end of the backplate layer and the second support layer toward the bending portion to form a notch; and a reinforcing member;

wherein the reinforcing member is disposed between the backplate layer and the second support layer, and the reinforcing member is disposed at least partially within the notch.

Optionally, in some embodiments of the present application, a material of the reinforcing member is same as a material of the backplate layer or a material of the second support layer.

Optionally, in some embodiments of the present application, a material of the reinforcing member is metal or organic.

Optionally, in some embodiments of the present application, the reinforcing member is integrated with the backplate layer or the second support layer.

Optionally, in some embodiments of the present application, the backplate layer is plastic or polyimide, the first support layer is a foam, and the material of the second support layer is stainless steel.

Optionally, in some embodiments of the present application, an edge of the backplate layer toward the bending portion is flush with an edge of the reinforcing member, and an edge of the second support layer toward the bending portion is flush with the edge of the reinforcing member.

Optionally, in some embodiments of the present application, an edge of the backplate layer toward the bending portion is flush with an edge of the reinforcing member, and an edge of the second support layer toward the bending portion is flush with the edge of the reinforcing member.

Optionally, in some embodiments of the present application, a thickness of the reinforcing member is same as a thickness of the first support layer.

Optionally, in some embodiments of the present application, a gap portion is defined between an edge of the reinforcing member and an edge of the first support layer.

Optionally, in some embodiments of the present application, a gap portion is defined between an edge of the reinforcing member and an edge of the first support layer.

Optionally, in some embodiments of the present application, a width of the gap portion is less than or equal to 100 µm.

Optionally, in some embodiments of the present application, an end of the backplate layer toward the bending portion protrudes beyond an end of the reinforcing member, and an end of the second support layer close to the bending portion is flush with an edge of the reinforcing member.

Optionally, in some embodiments of the present application, an end of the backplate layer toward the bending portion protrudes beyond an end of the reinforcing member, and an end of the second support layer close to the bending portion is flush with an edge of the reinforcing member.

Optionally, in some embodiments of the present application, a thickness of an end of the reinforcing member close to the bending portion is less than a thickness of an end of the reinforcing member away from the bending portion.

Optionally, in some embodiments of the present application, a thickness of an end of the reinforcing member close to the bending portion is less than a thickness of an end of the reinforcing member away from the bending portion.

Optionally, in some embodiments of the present application, the display module further includes:

a polarizer disposed on a front side of the non-bending portion of the display panel;

a protective adhesive layer disposed on a front side of the bending portion of the display panel, wherein the protective adhesive layer is contacted with an end surface of the polarizer;

wherein an orthographic projection of the first support layer on the backplate layer covers an orthographic projection of a contact portion of the polarizer and the protective adhesive layer on the backplate layer.

Accordingly, an embodiment of the present application provides a display device, wherein the display device comprises a display module, and the display module includes:

a display panel comprising a bending portion and a non-bending portion;

a backplate layer disposed on a back side of the non-bending portion of the display panel;

a first support layer disposed on a side of the backplate layer away from the display panel;

a second support layer disposed on a side of the first support layer away from the display panel;

wherein an end of the first support layer toward the bending portion is shrunk internally relative to an end of the backplate layer and the second support layer toward the bending portion to form a notch; and a reinforcing member;

wherein the reinforcing member is disposed between the backplate layer and the second support layer, and the reinforcing member is disposed at least partially within the notch; and the display device further comprises a driving chip and a circuit board connected to the bending portion of the display panel.

Optionally, in some embodiments of the present application, a material of the reinforcing member is same as a material of the backplate layer or a material of the second support layer.

Optionally, in some embodiments of the present application, the reinforcing member is integrated with the backplate layer or the second support layer.

Optionally, in some embodiments of the present application, the display device further includes:

a polarizer disposed on a front side of the non-bending portion of the display panel;

a protective adhesive layer disposed on a front side of the bending portion of the display panel, wherein the protective adhesive layer is contacted with an end surface of the polarizer;

wherein an orthographic projection of the first support layer on the backplate layer covers an orthographic projection of a contact portion of the polarizer and the protective adhesive layer on the backplate layer.

Beneficial Effects

In the embodiment of the present application, a display module and a display device are provided. A reinforcing member is provided at least partially in a notch to provide sufficient support for the display panel, thus avoiding stress concentration, preventing the display panel from collapsing above a notch, preventing cracks in a film layer such as a trace of the display panel, and improving a reliability of the display panel and the display device.

BRIEF DESCRIPTION OF THE DRAWINGS

In order to more clearly illustrate the technical solutions in the embodiments of the present application, the accompanying drawings required for use in the description of the embodiments will be briefly described below. It will be apparent that the accompanying drawings in the following description are merely some embodiments of the present application, and other drawings may be obtained from these drawings without creative effort by those skilled in the art.

DETAILED DESCRIPTION OF THE EMBODIMENTS

Figure 1:
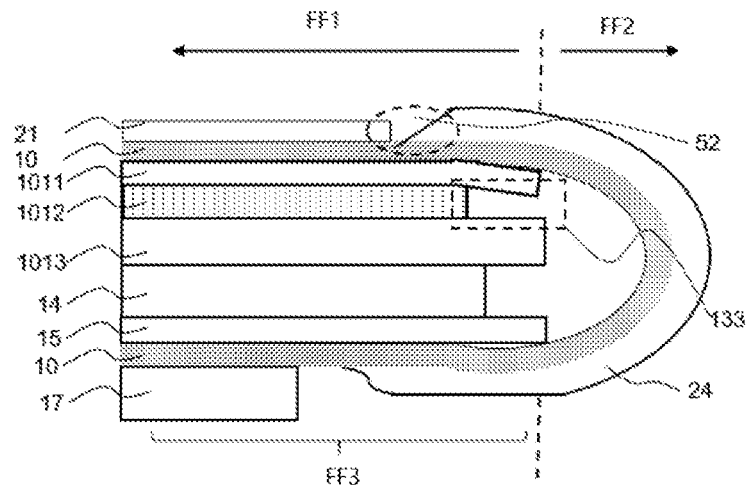
FIG. 1 is a schematic cross-sectional diagram showing a display module in prior art.

The following describes the technical solutions of the embodiments of the present application in a clear and complete manner with reference to the accompanying drawings in the embodiments of the present application. It will be apparent that the described embodiments are only a part of the embodiments of the present application, but not all of the embodiments. Based on the embodiments of the present application, all other embodiments obtained by those skilled in the art without creative effort fall within the scope of the present application. Furthermore, it should be understood that the specific embodiments described herein are intended only to illustrate and explain the present application and are not intended to limit the present application. And terms of direction "up" and "down" are used in the present application in the absence of a reverse description, generally referring to the upper and lower parts of the device in actual use or operation, in particular in the drawing direction. And terms "in" and "out" are for the profile of the device.

An embodiment of the present application provides a display module and a display device. The display module includes a display panel, a backplate layer, a first support layer, a second support layer, and a reinforcing member. The display panel includes a bending portion and a non-bending portion. The backplate layer is disposed on a back side of the non-bending portion of the display panel. The first support layer is disposed on a side of the backplate layer away from the display panel. The second support layer is disposed on a side of the first support layer away from the display panel. An end of the first support layer toward the bending portion is shrunk internally relative to an end of the backplate layer and the second support layer toward the bend portion to form a notch. The reinforcing member is disposed between the backplate layer and the second support layer, and the reinforcing member is disposed at least partially in a notch.

Embodiments of the present application provide a display module and a display device. Detailed description will be given below. It should be noted that the order of description of the following embodiments is not a limitation on a preferred order of the embodiments.

Embodiment 1

Figure 2:
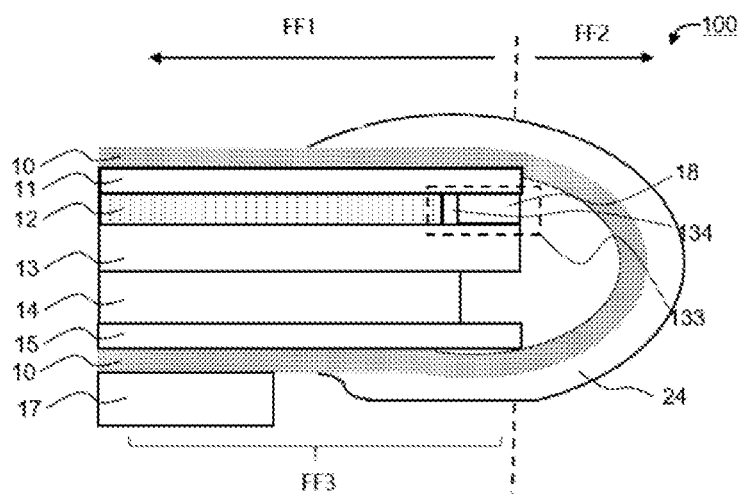
FIG. 2 is a first schematic cross-sectional diagram of a display module according to an embodiment of the present application.

Referring to FIG. 2 which is a first schematic cross-sectional diagram of a display module 100 according to an embodiment of the present application. The display module 100 includes a display panel 10, a backplate layer 11, a first support layer 12, a second support layer 13, and a reinforcing member 18. The display panel 10 includes a bending portion FF2 and a non-bending portion FF1. The backplate layer 11 is disposed on a back side of the non-bending portion FF1 of the display panel 10. The first support layer 12 is disposed on a side of the backplate layer 11 away from the display panel 10. The second support layer 13 is disposed on a side of the first support layer 12 away from the display panel 10. An end of the first support layer 12 toward the bending portion FF2 is shrunk internally relative to an end of the backplate layer 11 and the second support layer 13 toward the bend portion FF2 to form a notch 133. The reinforcing member 18 is disposed between the backplate layer 11 and the second support layer 13, and the reinforcing member 18 is disposed at least partially in a notch 133.

Specifically, the display panel 10 includes the bending portion FF2 and the non-bending portion FF1, and a binding portion FF3 connected to the bending portion FF2. The bending portion FF2 is disposed between the non-bending portion FF1 and the binding portion FF3, and the bending portion FF2 is used to dispose the binding portion FF3 on a back side of the non-bending portion FF1.

Specifically, the display panel 10 includes the bending portion FF2 and the non-bending portion FF1. The backplate layer 11, the first support layer 12, the second support layer 13, and the reinforcing member 18 are provided on the back side of the non-bending portion FF1 of the display panel 10. In a manufacturing process of the display module 100, the second support layer 13 needs to be grasped for positioning, thus, an end of the first support layer 12 toward the bent FF2 needs to be shrunk internally. This is, at an end toward the bending portion FF2, the backplate layer 11 and the second support layer 13 are protruded toward the bending portion FF2 relative to the first support layer 12 to form a notch 133. The reinforcing member 18 is disposed at least partially in the notch 133.

In some embodiments, a material of the reinforcing member 18 is same as a material of the backplate layer 11 or the second support layer 13, and the material of the reinforcing member 18 is metal or organic.

Specifically, since the material of the reinforcing member 18 is same as that of the backplate layer 11 or the second support layer 13, no new material is introduced. A reliability test step can be reduced when the display module 100 is manufactured, because no possibility of lowering the reliability due to introducing the new material exists. The metal or organic has strong toughness and deforms when subjected to an external force rather than breaking easily, thus it will not contaminate the display module 100 with foreign matter.

In some embodiments, the backplate layer 11 is plastic or polyimide or PET (polyester resin, polyethylene terephthalate), the first support layer 12 is foam and the second support layer 13 is stainless steel.

Specifically, a material of the backplate layer 11 may be plastic or polyimide or PET. Since the display panel 10 is too thin, the backplate layer 11 is used to provide a support to the display panel 10. A material of the first support layer 12 may be foam to provide a buffer to the display panel 10, such as buffering against impact of external forces. A material of the second support layer 13 may be stainless steel to provide a support for the display panel 10, so that the non-bending portion of the display panel 10 forms a planar state to facilitate display of an image.

In some embodiments, an edge of the backplate layer 11 toward the bend portion FF2 is flush with an edge of the reinforcing member 18, and an edge of the second support layer 13 toward the bend portion FF2 is flush with an edge of the reinforcing member 18.

Specifically, the edges of the backplate layer 11, the reinforcing member 18, and the second support layer 13 toward the bending portion FF2 are flush with each other, so that the reinforcing member 18 can provide a complete support to an initial bending portion of the bending portion FF2, while not interfering or affecting a bent shape of the bending portion FF2, thereby facilitating a reduction on a width of the bending portion and avoiding an increase of a frame width.

In some embodiments, a thickness of the reinforcing member 18 is same as a thickness of the first support layer 12.

Specifically, the thickness of the reinforcing member 18 is same as the thickness of the first support layer 12 so that the reinforcing member 18 fits exactly a height of the notch 133, and the reinforcing member 18 can provide the best support. Certainly, in some embodiments, the thickness of the reinforcing member 18 may be slightly greater or slightly less than the thickness of the first support layer 12 without affecting a reinforcing support effect of the reinforcing member 18.

In some embodiments, the edge of the reinforcing member 18 is designed to be not in contact with the first support layer 12.

In particular, it is preferable that the edge of the reinforcing member 18 exactly contacts with the first support layer 12. However, a length of the backplate layer 11 or the second support layer 13 protruding beyond the first support layer 12 may have an error (or a tolerance), in other words, a length of the notch 133 may have a certain fluctuation range, and a length of the reinforcing member 18 may have a tolerance. Therefore, the first support layer 12 and the edge of the reinforcing member 18 are generally designed as non-contact, for example, a gap portion 134 is defined. Thus, it can improve a bonding yield of the reinforcing piece 18 and help save cost.

In some embodiments, the gap portion 134 is defined between the edge of the reinforcing member 18 and the edge of the first support layer 12.

In some embodiments, a width of the gap portion 134 is less than or equal to 100 μm.

Specifically, in some embodiments, a width of the gap portion 134 between the reinforcing member 18 and the first support layer 12 is less than or equal to 100 μm. Ideally, the width of the gap portion 134 between the reinforcing member 18 and the first support layer 12 is 0. Since tolerances and errors exist in a material cutting and the bonding process, a smaller width of the gap portion 134 contributes to provide a support, while reducing a width of a frame.

It should be noted that, in some embodiments, the width of the reinforcing member 18 may be set between 200 μm to 500 μm, and the reinforcing member 18 may increase a support force and not occupy a larger width, thereby facilitating a narrow frame design.

The display panel 10 may be a body of an organic light-emitting display panel. For example, the display panel 10 includes an array substrate, a light-emitting device provided on the array substrate, and an encapsulation layer provided on the light-emitting device. A structure of the display panel 10 is not limited thereto.

In the embodiment of the present application, the reinforcing member 18 is provided, and the reinforcing member is provided at least partially in the notch 133, which can provide sufficient support for the display panel 10 and avoid stress concentration, preventing the display panel 10 from collapsing above the notch 133, preventing cracks in the film layer such as the trace of the display panel, and improving the reliability of the display panel module and the display device.

Embodiment 2

The present embodiment is same as or similar to the above-described embodiment except that the reinforcing member 18 is integrated with the backplate layer 11 or the second support layer 13.

Figure 3:
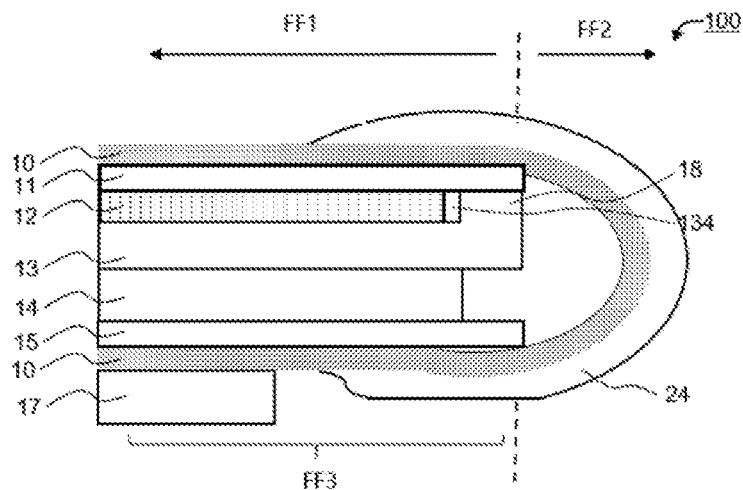
FIG. 3 is a second schematic cross-sectional diagram of a display module according to an embodiment of the present application.
Figure 4:
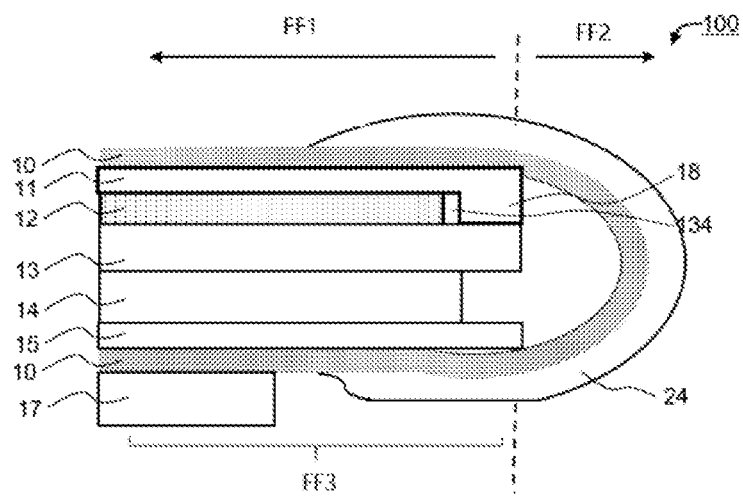
FIG. 4 is a third schematic cross-sectional diagram of a display module according to an embodiment of the present application.

Referring to FIGS. 3 and 4, FIG. 3 is a second schematic cross-sectional diagram of a display module 100 according to an embodiment of the present application, and FIG. 4 is a third schematic cross-sectional diagram of the display module 100 according to an embodiment of the present application.

Specifically, as shown in FIG. 3, the reinforcing member 18 is an integral part of an extending connection of the second support layer 13. That is, the reinforcing member 18 and the second support layer 13 are integrally formed, and the reinforcing member 18 and the second support layer 13 may be integrally formed by etching or the like. For example, both the reinforcing member 18 and the second support layer 13 may be made of SUS (stainless steel), and the reinforcing member 18 may be manufactured at a same time as the second support layer 13 is manufactured.

Specifically, as shown in FIG. 4, the reinforcing member 18 is an integral part of an extending connection of the backplate layer 11. That is, the reinforcing member 18 and the backplate layer 11 are integrally formed, and the reinforcing member 18 and the backplate layer 11 may be formed by integrally forming a film. For example, both the reinforcing member 18 and the backplate layer 11 are made of plastic or polyimide (PI) or PET, and the reinforcing member 18 is manufactured at a same time when the backplate layer 11 is manufactured.

According to the embodiment of the present application, by providing the reinforcing member 18 as an integral part of the extending connection of the backplate layer 11 or the second support layer 13, the reinforcing member 18 does not need to be manufactured separately, thereby saving a process of manufacturing the reinforcing member separately. At the same time, the reinforcing member 18 does not need a separate process to be disposed on the notch 133, as long as the backplate layer 11 or the second support layer 13 is provided, the reinforcing member 18 is provided at a same time, which has beneficial effects of simplifying manufacturing processes and saving materials.

Embodiment 3

The embodiment of the present application is same as or similar to the embodiment described above, except that an edge of the backplate layer 11 toward the bending portion FF2 protrudes beyond an edge of the reinforcing member 18.

Figure 5:
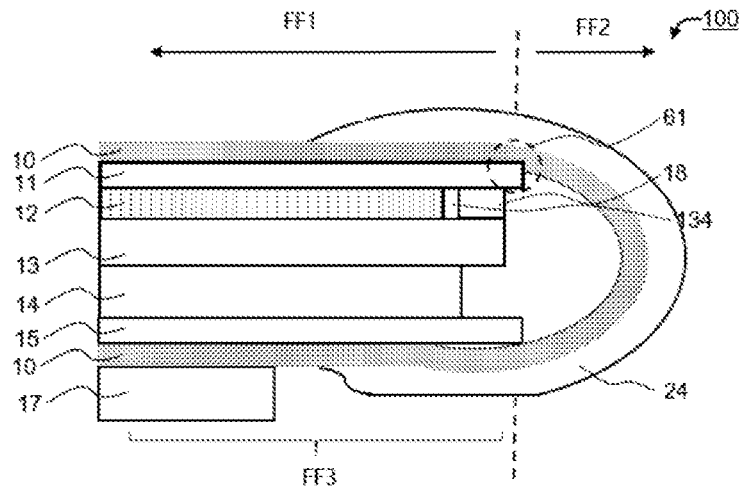
FIG. 5 is a fourth schematic cross-sectional diagram of a display module according to an embodiment of the present application.

Referring to FIG. 5 which is a fourth schematic cross-sectional diagram of a display module 100 according to an embodiment of the present application.

In the present embodiment, an edge of the second support layer 13 toward the bending portion FF2 is flush with an edge of the reinforcing member 18, and an edge of the backplate layer 11 toward the bending portion FF2 protrudes beyond an edge of the reinforcing member 18.

In the present embodiment, the edges of the reinforcing member 18 and the second support layer 13 toward an edge of the bending portion FF2 are flush with each other, so that the reinforcing member 18 provides a complete reinforcing support effect to avoid stress concentration. At a same time, the edge of the backplate layer 11 toward the bending portion FF2 protrudes a certain length with respect to the edge of the reinforcing member 18. As shown in FIG. 5, a protruding portion 61 of the backplate layer 11 does not affect the reinforcing and supporting effect of the reinforcing member 18. Meanwhile, a bonding yield of the backplate layer 11, the reinforcing member 18, and the second support layer 13 is improved, there is an error (or a tolerance) when the reinforcing member 18 and the second support layer 13 as a whole are bonded to the backplate layer 11. If the edge of the backplate layer 11 toward the bending portion FF2 protrudes beyond the reinforcing member 18 by a certain length, the edge of the reinforcing member 18 toward the bending portion FF2 can be well prevented from protruding beyond the edge of the backplate layer FF1 toward the bending portion FF2 after bonding, thereby improving a bonding yield.

Embodiment 4

The embodiment of the present application is same as or similar to the embodiment described above except that a thickness of an end of the reinforcing member 18 close to the bending portion FF2 is less than a thickness of an end of the reinforcing member 18 away from the bending portion FF1.

Figure 6:
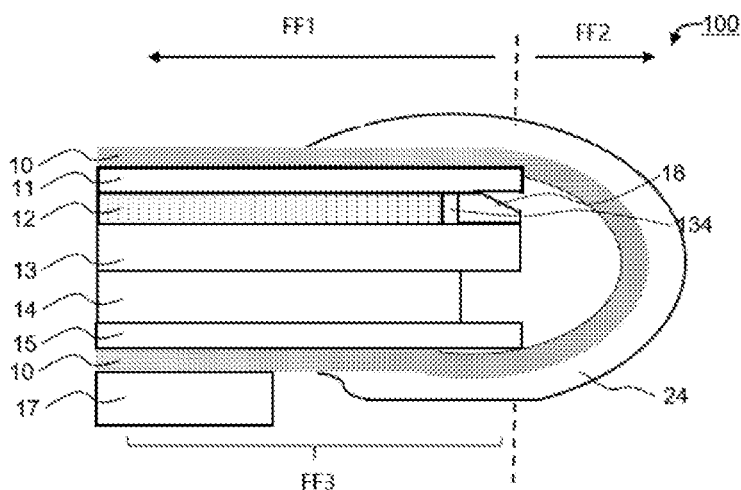
FIG. 6 is a fifth schematic cross-sectional diagram of a display module according to an embodiment of the present application.

Referring to FIG. 6 which is a fifth schematic cross-sectional diagram of a display module 100 according to an embodiment of the present application.

In the present embodiment, the thickness of the end of the reinforcing member 18 close to the bending portion FF2 is less than the thickness of the end of the reinforcing member 18 away from the bending portion FF1.

Specifically, an edge of the bending portion FF2 has a tendency to bend, and the thickness of the end of the reinforcing member 18 close to the bending portion FF2 is less than the thickness of the end of the reinforcing member 18 away from the bending portion FF1, so that a shape of the reinforcing member 18 fits the bending tendency of the edge of the bending portion FF2. Even if a process error exists, for example, the reinforcing member is deviated when approaching to the bending portion FF2, an effect and an interference of the reinforcing member 18 on a bending of the bending portion FF2 is avoided, and an enlargement of a width of a frame is avoided due to a reduction on the thickness of the end of the reinforcing member 18 close to the bending portion FF2.

Embodiment 5

The present embodiment is same as or similar to the above embodiment except that the present embodiment further includes other structures.

Figure 7:
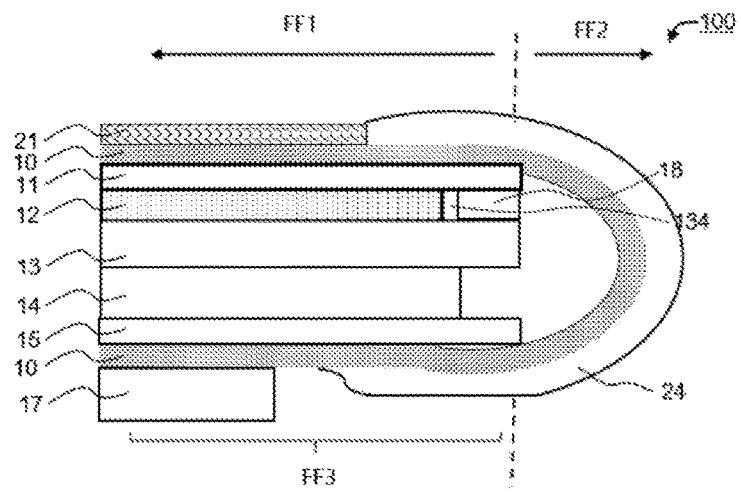
FIG. 7 is a sixth schematic cross-sectional diagram of the display module according to an embodiment of the present application.

Referring to FIG. 7 which is a sixth schematic cross-sectional diagram of a display module 100 according to an embodiment of the present application.

The display module 100 further includes a polarizer 21 and a protective adhesive layer 24. The polarizer 21 is disposed on a front side of the non-bending portion FF1 of the display panel 10. The protective adhesive layer 24 is provided on a front side of the bending portion FF2 of the display panel 10. The protective adhesive layer 24 contacts an end surface of the polarizer 21. An orthographic projection of the first support layer 12 on the backplate layer 11 covers an orthographic projection of a contact portion of the polarizer 21 and the protective adhesive layer 24 on the backplate layer 11.

Specifically, the protective adhesive layer 24 contacts the end surface of the polarizer 21, so the protective adhesive layer 24 also protects the end surface of the polarizer 21 from water vapor and the like entering an interior of the polarizer 21 through the end surface of the polarizer 21, thereby improving the reliability of the display module 100. The orthographic projection of the first support layer 12 on the backplate layer 11 covers the orthographic projection of the contact portion of the polarizer 21 and the protective adhesive layer 24 on the backplate layer 11, so that the contact portion of the polarizer 21 and the protective adhesive layer 24 and other regions of the non-bending portion FF1 of the display panel 10 are uniformly stacked, and a situation of a stress received by the contact portion of the polarizer 21 and the protective adhesive layer 24 is same as a situation of a stress received by other portions of the non-bending portion FF2. Thus, a separation of the protective adhesive layer 24 and the polarizer 21 is well avoided, the influence of water vapor intrusion on the reliability is avoided, and the reliability of the display module 100 is improved.

Embodiment 6

The embodiment of the present application is same as or similar to the embodiment described above, a difference is a structure applicable to the reinforcing member 18 and the second support layer 13 in the embodiment described above.

Figure 8:
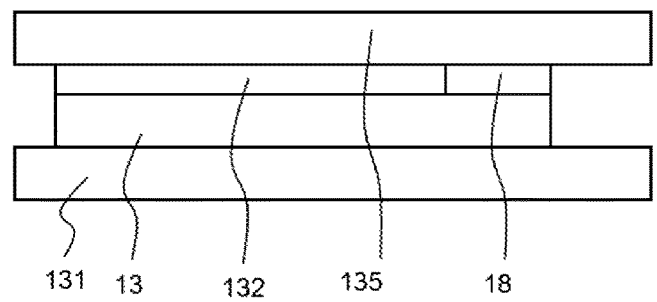
FIG. 8 is a schematic cross-sectional diagram of a reinforcing member and a second support layer according to an embodiment of the present application.
Figure 9:
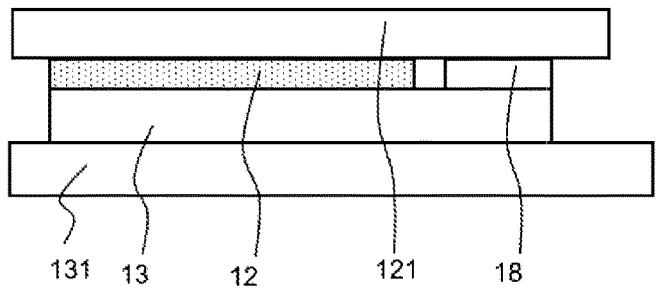
FIG. 9 is a schematic cross-sectional diagram of a reinforcing member and a second support layer being bonded to a first support layer according to an embodiment of the present application.

Referring to FIGS. 8 and 9, wherein FIG. 8 is a schematic cross-sectional diagram of the reinforcing member 18 and a second support layer 13 according to an embodiment of the present application, and FIG. 9 is a schematic cross-sectional diagram of the reinforcing member 18 and the second support layer 15 as a whole being bonded to a first support layer 12 according to an embodiment of the present application.

Specifically, in the embodiment of the present application, when feeding, an integral structure of the reinforcing member 18 as an extending connection of the second support layer 13 is described in detail. That is, the reinforcing member 18 and the second support layer 13 are integrally connected to each other, and the reinforcing member 18 and the second support layer 13 may be formed by integrally etching or the like.

Specifically, as shown in FIG. 8, when materials are received, the reinforcing member 18 is an integral structure of an extending connection of the second support layer 13. The upper and lower surfaces of the integral structure of the reinforcing member 18 and the backplate layer 11 respectively include a first release film 135 and a second release film 131. A filling layer 132 is provided between the first release film 135 and the second support layer 13, and the filling layer 132 is arranged in a same layer as the reinforcing member 18. A material of the filling layer 132 can be plastic or the like. A function of the filling layer 132 is to provide support for the first release film 135. The first release film 135 and the second release film 131 play a protective role against foreign matter and scratches.

Specifically, as shown in FIG. 9, when the reinforcing member 18 and the second support layer 13 as whole are integrally bonded to the first support layer 12, the first release film 135 and the filling layer 132 are removed, the first support layer 12 is bonded to a portion of the filling layer 132, and a third release film 121 of the first support layer 12 is retained.

Embodiment 7

An embodiment of the present application further provides a display device 200 including the display module 100 of any one of the above embodiments, and further including a drive chip and a circuit board (not shown) electrically connected to the bending portion FF22 of the display panel 10. Specifically, the drive chip and the circuit board are connected to pads on the binding portion FF3.

Figure 10:
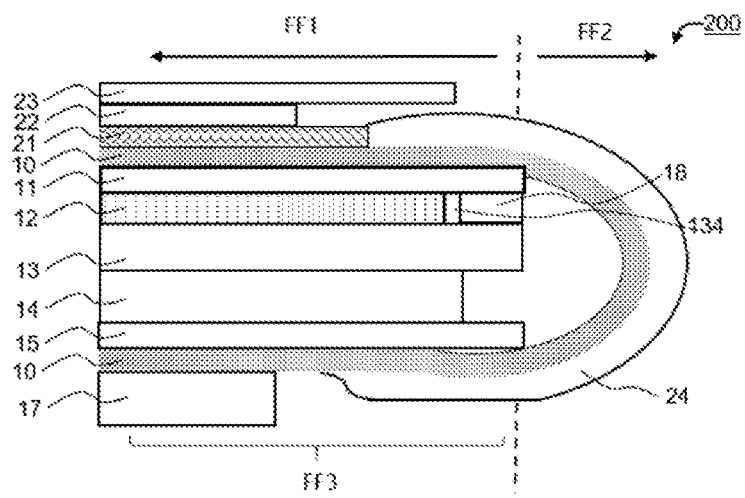
FIG. 10 is a schematic cross-sectional diagram of a display device according to an embodiment of the present application.

Specifically, in some embodiments, referring to FIG. 10, and FIG. 10 shows a structure of the display device 200. The display device 200 further includes a window 23 (or a protective cover plate, cover glass) bonded to a front side of the polarizer 21. The window 23 is bonded to the polarizer 21 through an optical adhesive layer 22 such as OCA or OCR. The display device 200 further includes a protective support layer 15 bonded to the binding portion FF3 of the display panel 10. The binding portion FF3 of the display panel 10 is bonded to the second support layer 13 through a double-sided adhesive layer 14. The protective support layer 15 may have a same material as the backplate layer 11. Specifically, the backplate layer 11 and the protective support layer 15 are patterned backplate material layers. When the display panel 10 is in a planar state, the patterned backplate material layer is bonded to a back side of the display panel 10. The binding portion FF3 of the display panel 10 is bonded to a portion of the second support layer 13, and a protective layer 17 may be provided on a surface of the binding portion FF3 away from the protective support layer 15. A material of the protective layer 17 may be plastic, for example, PET and the like.

In the display module and the display device provided in the embodiment of the present application, the reinforcing member 18 is provided, and the reinforcing member is provided at least partially in the notch 133, which can provide sufficient support for the display panel 10, thereby avoiding stress concentration, preventing the display panel 10 from collapsing above the notch 133, preventing cracks from generating in the film layer such as the trace of the display panel, and improving the reliability of the display module and the display device.

It should be noted that in the embodiment of the present application, the front side refers to a side on which the display panel displays images, the back side refers to another side opposite to the front side, for example, the front side of the display panel 10 refers to a side on which the polarizer 21 is bonded to, and the back side of the display panel 10 refers to a side on which the backplate layer 11 is provided.

The display module and display device provided in the embodiments of the present application are described in detail above. The principles and embodiments of the present application are described in detail herein. The description of the embodiments is merely intended to help understand the method and core ideas of the present application. At the same time, a person skilled in the art may make changes in the specific embodiments and application scope according to the idea of the present application. In conclusion, the content of the specification should not be construed as a limitation to the present application.

What is claimed is:

1. A display module, comprising:
   a display panel comprising a bending portion and a non-bending portion;
   a backplate layer disposed on a back side of the non-bending portion of the display panel;
   a first support layer disposed on a side of the backplate layer away from the display panel;
   a second support layer disposed on a side of the first support layer away from the display panel;
   wherein an end of the first support layer toward the bending portion is shrunk internally relative to an end of the backplate layer and the second support layer toward the bending portion to form a notch; and
   a reinforcing member;
   wherein the reinforcing member is disposed between the backplate layer and the second support layer, and the reinforcing member is disposed at least partially within the notch.

2. The display module according to claim 1, wherein a material of the reinforcing member is same as a material of the backplate layer or a material of the second support layer.

3. The display module according to claim 2, wherein a material of the reinforcing member is metal or organic.

4. The display module according to claim 2, wherein the reinforcing member is integrated with the backplate layer or the second support layer.

5. The display module according to claim 4, wherein the backplate layer is plastic or polyimide, the first support layer is a foam, and the material of the second support layer is stainless steel.

6. The display module according to claim 2, wherein an edge of the backplate layer toward the bending portion is flush with an edge of the reinforcing member, and an edge of the second support layer toward the bending portion is flush with the edge of the reinforcing member.

7. The display module according to claim 2, wherein a gap portion is defined between an edge of the reinforcing member and an edge of the first support layer.

8. The display module according to claim 2, wherein an end of the backplate layer toward the bending portion protrudes beyond an end of the reinforcing member, and an end of the second support layer close to the bending portion is flush with an edge of the reinforcing member.

9. The display module according to claim 2, wherein a thickness of an end of the reinforcing member close to the bending portion is less than a thickness of an end of the reinforcing member away from the bending portion.

10. The display module according to claim 1, wherein an edge of the backplate layer toward the bending portion is flush with an edge of the reinforcing member, and an edge of the second support layer toward the bending portion is flush with the edge of the reinforcing member.

11. The display module according to claim 10, wherein a thickness of the reinforcing member is same as a thickness of the first support layer.

12. The display module according to claim 1, wherein a gap portion is defined between an edge of the reinforcing member and an edge of the first support layer.

13. The display module according to claim 12, wherein a width of the gap portion is less than or equal to 100 μm.

14. The display module according to claim 1, wherein an end of the backplate layer toward the bending portion protrudes beyond an end of the reinforcing member, and an end of the second support layer close to the bending portion is flush with an edge of the reinforcing member.

15. The display module according to claim 1, wherein a thickness of an end of the reinforcing member close to the bending portion is less than a thickness of an end of the reinforcing member away from the bending portion.

16. The display module according to claim 1, wherein the display module further comprises:
    a polarizer disposed on a front side of the non-bending portion of the display panel;
    a protective adhesive layer disposed on a front side of the bending portion of the display panel, wherein the protective adhesive layer is in contact with an end surface of the polarizer;
    wherein an orthographic projection of the first support layer on the backplate layer covers an orthographic projection of a contact portion of the polarizer and the protective adhesive layer on the backplate layer.

17. A display device, wherein the display device comprises a display module, and the display module comprises:
    a display panel comprising a bending portion and a non-bending portion;
    a backplate layer disposed on a back side of the non-bending portion of the display panel;
    a first support layer disposed on a side of the backplate layer away from the display panel;
    a second support layer disposed on a side of the first support layer away from the display panel;
    wherein an end of the first support layer toward the bending portion is shrunk internally relative to an end of the backplate layer and the second support layer toward the bending portion to form a notch; and
    a reinforcing member;
    wherein the reinforcing member is disposed between the backplate layer and the second support layer, and the reinforcing member is disposed at least partially within the notch.

18. The display device according to claim 17, wherein a material of the reinforcing member is same as a material of the backplate layer or a material of the second support layer.

19. The display device according to claim 18, wherein the reinforcing member is integrated with the backplate layer or the second support layer.

20. The display device according to claim 19, wherein the display device further comprises:
    a polarizer disposed on a front side of the non-bending portion of the display panel;
    a protective adhesive layer disposed on a front side of the bending portion of the display panel, wherein the protective adhesive layer is contacted with an end surface of the polarizer;

wherein an orthographic projection of the first support layer on the backplate layer covers an orthographic projection of a contact portion of the polarizer and the protective adhesive layer on the backplate layer.

* * * * *